US010224335B2

United States Patent
Wong et al.

(10) Patent No.: US 10,224,335 B2
(45) Date of Patent: Mar. 5, 2019

(54) INTEGRATED CIRCUITS

(71) Applicant: HEWLETT-PACKARD DEVELOPMENT COMPANY, L.P., Houston, TX (US)

(72) Inventors: Wai Mun Wong, Singapore (SG); Leong Yap Chia, Singapore (SG); Ning Ge, Palo Alto, CA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/541,986

(22) PCT Filed: Jan. 29, 2015

(86) PCT No.: PCT/US2015/013431
§ 371 (c)(1),
(2) Date: Jul. 6, 2017

(87) PCT Pub. No.: WO2016/122509
PCT Pub. Date: Aug. 4, 2016

(65) Prior Publication Data
US 2018/0012900 A1 Jan. 11, 2018

(51) Int. Cl.
*H01L 29/49* (2006.01)
*H01L 27/11521* (2017.01)
(Continued)

(52) U.S. Cl.
CPC .... *H01L 27/11521* (2013.01); *G11C 16/0433* (2013.01); *H01L 27/1156* (2013.01)

(58) Field of Classification Search
CPC .......... H01L 27/11521; H01L 27/1156; G11C 16/0433
See application file for complete search history.

(56) References Cited

U.S. PATENT DOCUMENTS 4,654,825 A 3/1987 Rinerson
4,924,278 A 5/1990 Logie
(Continued)

FOREIGN PATENT DOCUMENTS

| JP | H05-335656 | 12/1993 |
| JP | H09-135001 | 5/1997 |
| WO | WO-2015/167498 | 11/2015 |

OTHER PUBLICATIONS

Prall, K. et al. Characterization and Suppression of Drain Coupling in Submicrom EPROM Cells. Dec. 1987.

*Primary Examiner* — Yu Chen
(74) *Attorney, Agent, or Firm* — HP Inc.—Patent Department

(57) ABSTRACT

The present subject matter relates to an integrated circuit comprising an erasable programmable read only memory (EPROM) array having a plurality of EPROM cells disposed in rows and columns, wherein one or more EPROM cells located at predetermined positions in the EPROM array are selectively dischargeable. The one or more EPROM cells comprise a EPROM transistor having a first conductive layer to store electrons upon the EPROM transistor being programmed and a control metal oxide semiconductor field-effect transistor (MOSFET) electrically connected to the first conductive layer to provide an electron leakage path to dissipate the electrons stored in the first conductive layer in a predetermined leak time period.

20 Claims, 4 Drawing Sheets

(51) Int. Cl.
*H01L 27/1156* (2017.01)
*G11C 16/04* (2006.01)

(56) References Cited

U.S. PATENT DOCUMENTS

| | | | |
|---|---|---|---|
| 5,329,487 A | 7/1994 | Gupta et al. | |
| 5,472,892 A | 12/1995 | Gwen et al. | |
| 5,625,211 A | 4/1997 | Kowshik | |
| 5,764,096 A | 6/1998 | Lipp et al. | |
| 5,914,514 A | 6/1999 | Dejenfelt et al. | |
| 6,862,223 B1 * | 3/2005 | Lee | H01L 27/11524 |
| | | | 257/E27.103 |
| 7,108,605 B2 | 9/2006 | Lemay et al. | |
| 7,365,387 B2 | 4/2008 | Benjamin | |
| 7,602,029 B2 * | 10/2009 | Mallikararjunaswamy | |
| | | | H01L 27/115 |
| | | | 257/314 |
| 8,068,370 B2 * | 11/2011 | Lue | G11C 16/0408 |
| | | | 257/315 |
| 8,575,686 B2 * | 11/2013 | Masuoka | H01L 27/11521 |
| | | | 257/321 |
| 2005/0258474 A1 * | 11/2005 | Tanaka | G11C 16/30 |
| | | | 257/316 |
| 2008/0112225 A1 | 5/2008 | Benjamin | |
| 2008/0273392 A1 | 11/2008 | Ratnakumar et al. | |
| 2012/0020157 A1 * | 1/2012 | Lee | G11C 16/0433 |
| | | | 365/185.05 |

\* cited by examiner

INTEGRATED CIRCUITS

BACKGROUND

Many electronic devices, such as consumer electronics, automobiles, computing systems, and other devices associated with the computing systems, include integrated circuits to perform a variety of tasks. Accordingly, various integrated circuits may have varying configurations depending on end tasks to be performed. For example, integrated circuits may be memory chips that may store data.

Integrated circuits, such as read-only memory (ROM) chips, programmable read-only memory (PROM) chips, electronically programmable read-only memory (EPROM), and the like may be used to store data. Such chips generally comprise a plurality of memory cells arranged in an array. The memory cells may be in a high resistance state or a low resistance state to store one bit of data corresponding to logic '1' or logic '0', respectively.

BRIEF DESCRIPTION OF FIGURES

The detailed description is provided with reference to the accompanying figures. In the figures, the left-most digit(s) of a reference number identifies the figure in which the reference number first appears. The same numbers are used throughout the figures to reference like features and components.

DETAILED DESCRIPTION

Figure 1:
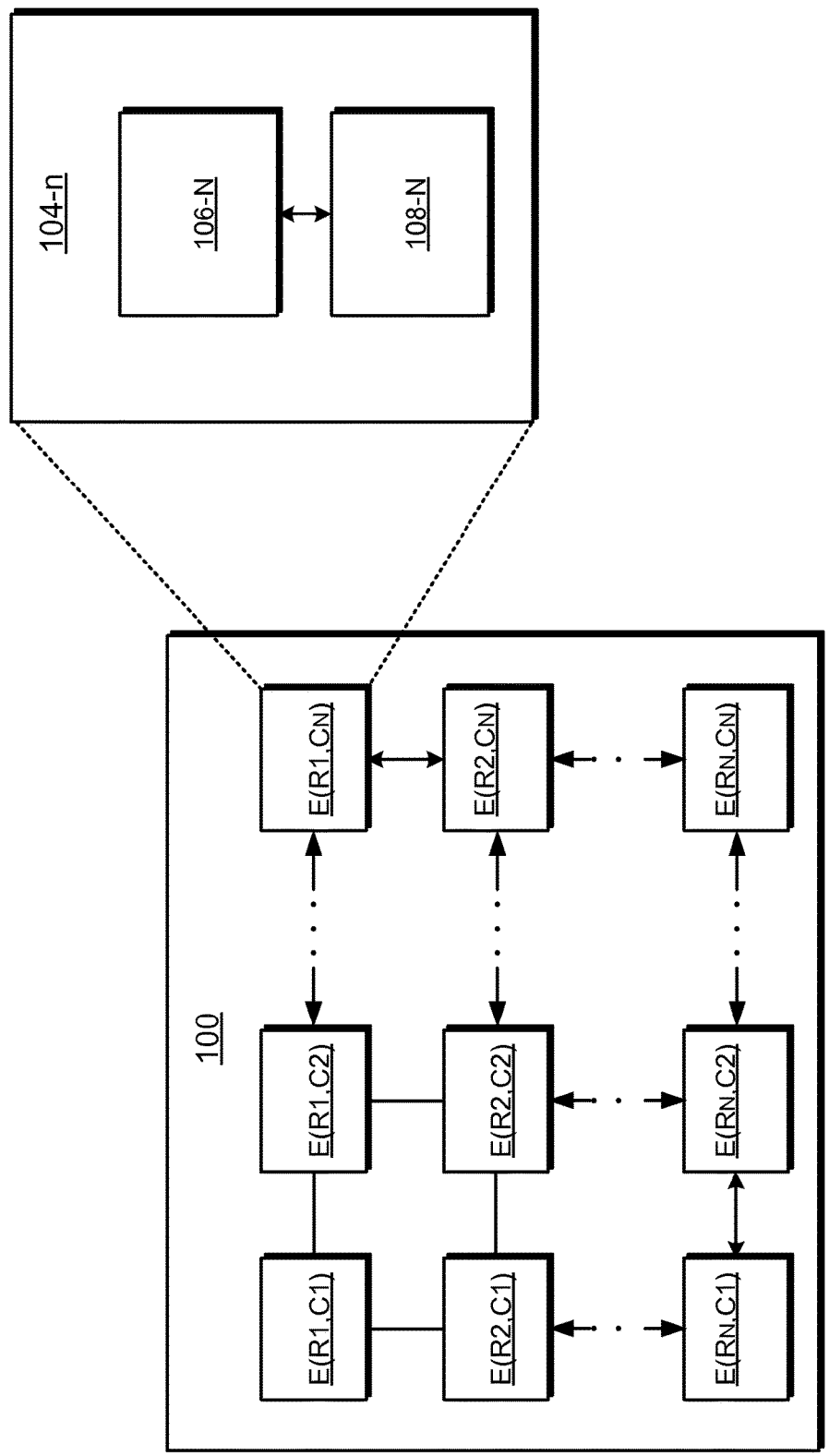
FIG. 1 illustrates an integrated circuit, in accordance with one example implementation of the present subject matter.

The present subject matter relates to an integrated circuit, such as a memory chip. In an example, the memory chip may be an erasable programmable read only memory (EPROM) chip having an EPROM array. An EPROM array generally comprises a conductive grid of columns and rows with an EPROM cell disposed at each intersection of the rows and columns. Each EPROM cell has two gates that are separated from each other by a dielectric layer. One of the gates is called a floating gate and the other is called an input gate. The floating gate links to a corresponding row through the control gate.

The floating gate, initially, has no charge, which causes the EPROM cell to be in a low resistance state, giving a value of logic '0' to a bit stored in the EPROM cell. To change the value of the bit to logic '1', i.e., a high resistance state, a programming voltage is applied to the input gate the EPROM cell. The programming voltage is such that an adequate quantity of electrons is pushed into the floating gate, thereby increasing a threshold voltage of the EPROM cell. Once programmed, the electrons remain stored in the floating gate and the EPROM cell holds the charge until it is further reprogrammed.

In accordance with one example implementation of the present subject matter, a selectively dischargeable EPROM cell that may dissipate the stored charge in a predetermined time is described. Further, in accordance with one example implementation of the present subject matter, an integrated circuit comprising an EPROM array, having one or more selectively dischargeable EPROM cells disposed at predetermined positions in the EPROM array, is also described.

In an example, each of the selectively dischargeable EPROM cell comprises an EPROM transistor and a control metal oxide semiconductor field-effect transistor (MOSFET) electrically connected to each other. The EPROM transistor comprises a first conductive layer forming the floating gate of the EPROM transistor. The floating gate is connected to the control MOSFET. In accordance with one example implementation of the present subject matter, the control MOSFET may be operated to provide an electron leakage path to dissipate the electrons that get stored in the floating gate when the EPROM cell is programmed. Accordingly, an EPROM cell which may otherwise store the charge for a substantially longer duration, may lose the charge in the predetermined leak time period upon operation of the control MOSFET.

In an example, the integrated circuits comprising the EPROM array, may have one or more selectively dischargeable EPROM cells, that change state in the predetermined leak time period, included at predetermined positions in the EPROM array. The described integrated circuits may be used for a variety of applications, for instance, to check quality of circuits on consumables, such as print cartridges, which may include ink cartridges and titration print heads. Further, in one example, traditional systems and methods may be used for testing and programming the presently described integrated circuits that incorporate one or more selectively dischargeable EPROM cell, thereby making it convenient to use the present integrated circuits in various devices without incurring extra costs.

The above discussed integrated circuits and selectively dischargeable EPROM cells are further described in the figures and associated description below. It should be noted that the description and figures merely illustrate the principles of the present subject matter. It will thus be appreciated that various arrangements that embody the principles of the present subject matter, although not explicitly described or shown herein, can be devised from the description and are included within its scope.

FIG. 1 illustrates an integrated circuit 100, in accordance with one example implementation of the present subject matter. In an example, the integrated circuit 100 may be a non-volatile memory chip, such as an Electrically Programmable Read Only Memory (EPROM) chip. The EPROM chip may include an EPROM array 102 amongst other things. The EPROM array 102 comprises a plurality of EPROM cells E(R1,C1), E(R1,C2) . . . , E(Rn,Cn). As illustrated, EPROM cells E(R1,C1), E(R1,C2) . . . , E(Rn, Cn) of the EPROM array 102 are disposed in rows and columns in a grid-like manner.

In an example implementation, the EPROM array 102 may comprise one or more selectively dischargeable EPROM cells 104-1, 104-2, 104-3 . . . , and 104-n located at predetermined positions in the EPROM array 102. In other words, one or more EPROM cells E(R1,C1), E(R1, C2) . . . , E(Rn, Cn) in the EPROM array 102 may be selectively dischargeable. Such EPROM cells E(R1,C1), E(R1,C2) . . . , E(Rn,Cn), are herein referred to as selectively dischargeable EPROM cells 104-1, 104-2, 104-3 . . . , and 104-n. In the illustrated example implementation, the last EPROM cell E(R1, Cn) of the first row of the EPROM array 102 is selectively dischargeable.

The selectively dischargeable EPROM cell E(R1, Cn), hereinafter referred to as EPROM cell 104-n, comprises an EPROM transistor 106-n and a control MOSFET 108-n. The EPROM transistor 106-n comprises a floating gate, which is connected to the control MOSFET 108-n.

In operation, upon programming of the EPROM cell 104-n, the floating gate stores electrons while the control MOSFET 108-n provides an electron leakage path to dissipate the electrons stored in the floating gate. Accordingly, the EPROM cell 104-n may be programmed, for example, by applying a programming voltage and simultaneously, or after a time gap, the control MOSFET 108-n may be operated, for example, by supplying a control voltage to the control MOSFET 108-n. On operation of the control MOSFET 108-n, the electrons stored in the floating gate are dissipated in a predetermined leak time period. In an example, the predetermined leak time period may be based on the control voltage provided to the control MOSFET 108-n.

Accordingly, the EPROM cell 104-n, which ordinarily would have retained the electrons in the floating gate for a substantially long time after being programmed, dissipates the same in the predetermined leak time period upon on the operation of the control MOSFET 108-n. Thus, in an example implementation, where the entire EPROM array 102 may be programmed, while the other EPROM cells of the EPROM array 102 retain the charge, the selectively dischargeable EPROM cells 104-1, 104-2, 104-3 . . ., and 104-n, may leak the charge.

Leaking of the charge by the selectively dischargeable EPROM cells 104-1, 104-2, 104-3 . . ., and 104-n causes a change in the data programmed in the EPROM array 102. The change in the data is in accordance with the predetermined location of the selectively dischargeable EPROM cells 104-1, 104-2, 104-3 . . ., and 104-n. This may be better explained with the help of the example provided below.

Consider an EPROM array comprising a single row of eight EPROM cells, for instance. Upon programming, each of the eight EPROM cells may store one bit of data having a logic '1' value and accordingly, the data stored in the EPROM array may be 255. If, in the present example, the EPROM cell at a least significant bit (LSB) position of the EPROM array is a selectively dischargeable EPROM cell, the LSB bit will become logic '0' after the predetermined leak time period due to the leakage of the charge. Thus, the data read from the EPROM array after the predetermined leak time period will be 254 and not 255. Similarly, in case the EPROM cell at the LSB+1 position is selectively dischargeable, the data read from the EPROM array after the predetermined leak time period is 253.

Since the location of the selectively dischargeable EPROM cells 104-1, 104-2, 104-3 . . ., and 104-n is predetermined, the change in the data that is programmed in the integrated circuit 100 may be determined. Such a determination may be further used for various purposes, for example, to identify source of a given product. For example, a controller may write data onto the integrated circuit 100 and subsequently read the data after the lapse of the predetermined leak time period. If the change in the data written in the integrated circuit 100 is in accordance with the predetermined positions of the selectively dischargeable EPROM cells 104-1, 104-2, 104-3 . . ., and 104-n, as provided to the controller by a source, the controller may determine the integrated circuit 100, or a product that may incorporate the integrated circuit 100, to be associated with the source.

Figure 2A:
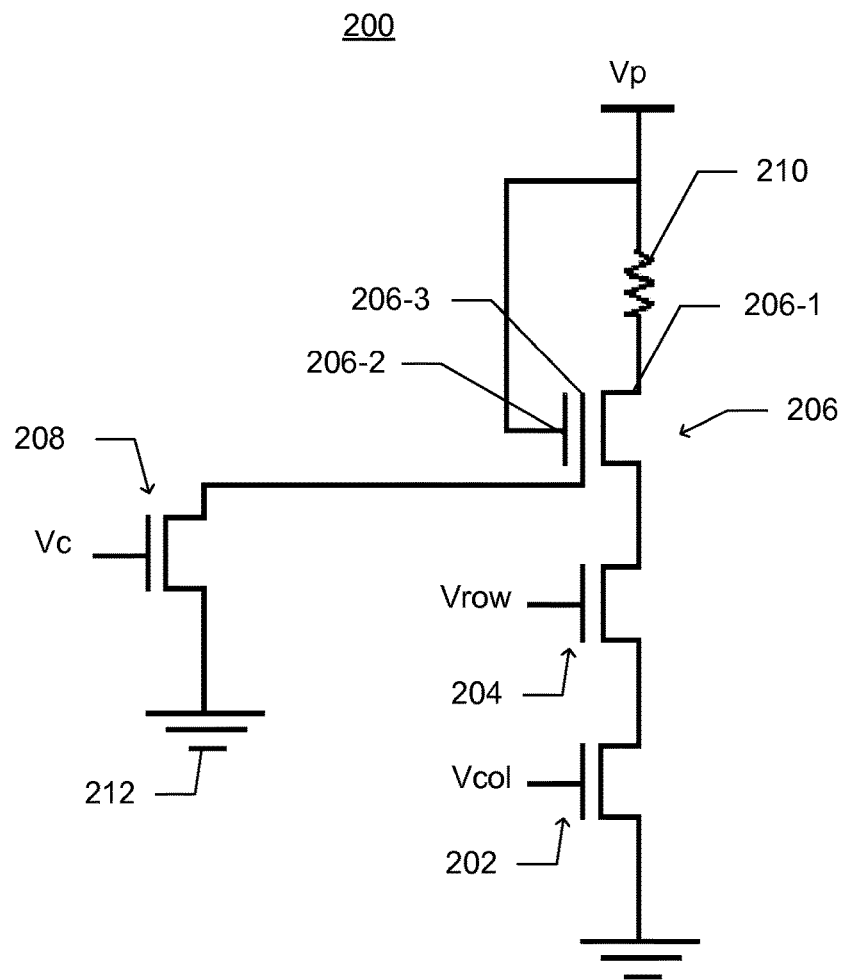
FIG. 2a illustrates a selectively dischargeable erasable programmable read only memory (EPROM) cell according to an example of the present subject matter.

Further details of working of a selectively dischargeable EPROM cell is provided in reference to FIG. 2a that illustrates a selectively dischargeable EPROM cell 200 according to an example of the present subject matter.

As mentioned previously, an EPROM chip comprises a conductive grid of rows and columns (not shown in Figures). An EPROM cell, for example, the selectively dischargeable EPROM cell 200 depicted in FIG. 2a is present at an intersection of a row and a column. The selectively dischargeable EPROM cell 200, also referred to as the EPROM cell 200 for simplicity, comprises a column control transistor 202 and a row control transistor 204 along with an EPROM transistor 206 and a control MOSFET 208. In an example implementation, the EPROM transistor 206 and the control MOSFET 208, respectively, are similar to the EPROM transistor 104-n and control MOSFET 108-n explained earlier.

To program the EPROM cell 200, the EPROM cell 200 is selected by applying a voltage, referred to as $V_{row}$ to the row control transistor 204 and a voltage, referred to as $V_{col}$ to the column control transistor 202. A programming voltage $V_p$ is then applied across a drain 206-1 and an input gate 206-2 of the EPROM transistor 206 to program the EPROM transistor 206. In an example, a resistor 210 may be disposed in series between the drain 206-1 and a source of the programming voltage $V_p$ to provide a breakdown current limit for the EPROM cell 200. The programming voltage $V_p$ causes electrons to get trapped in a floating gate 206-3 of the EPROM transistor 206. Further, as discussed earlier, the floating gate 206-3 is electrically connected to the control MOSFET 208 and the control MOSFET 208 may be selectively operated by applying a control voltage $V_c$, to provide a path to leak the charges stored in the floating gate 206-3 of the EPROM transistor 206 to a system ground 212.

Figure 2B:
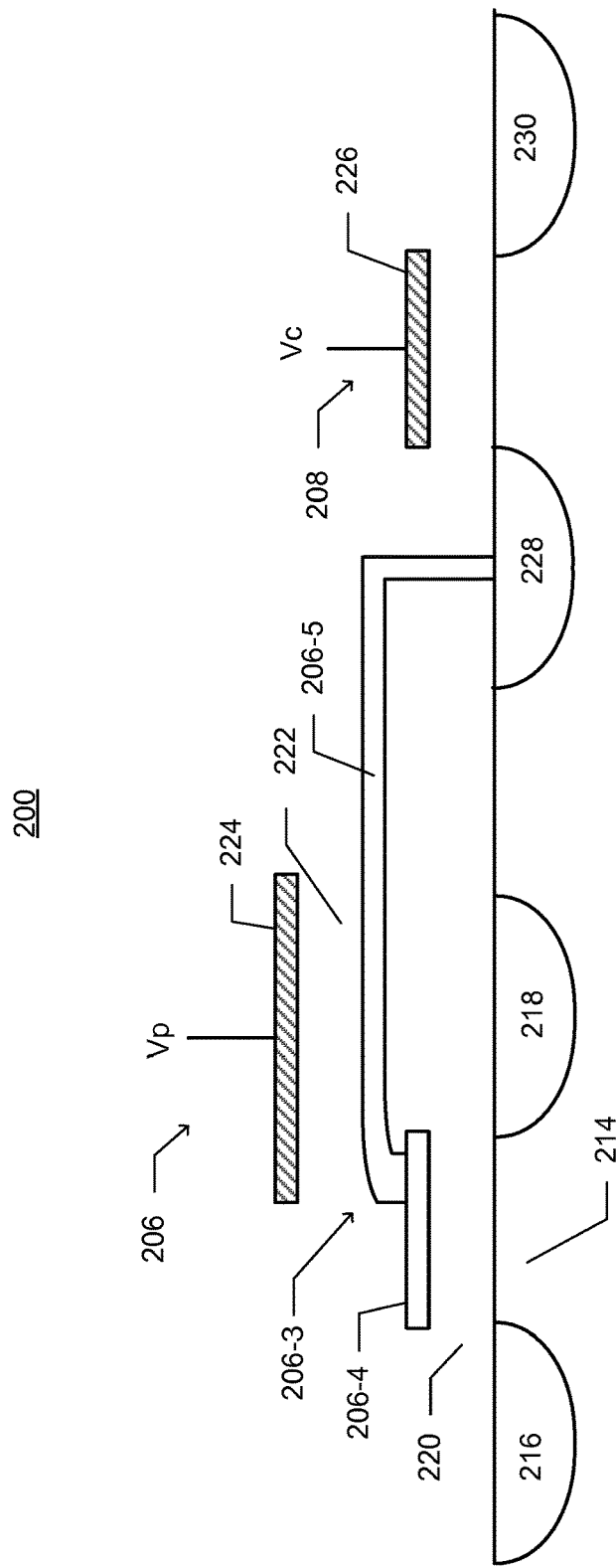
FIG. 2b illustrates the selectively dischargeable EPROM cell according to another example of the present subject matter.

The operation of the EPROM cell 200 may be further elaborated with reference to FIG. 2b that depicts the construction of the EPROM cell 200 in accordance with an example implementation of the present subject matter. The figure shows the EPROM cell 200 comprising the EPROM transistor 206 and the control MOSFET 208 such that the floating gate 206-3 of the EPROM transistor 206 is connected to the control MOSFET 208. It may be noted that the column control transistor 202, row control transistor 204, and the resistor 210 have not been shown in FIG. 2b.

As illustrated, the EPROM transistor 206 is made of a semiconductor substrate 214 having a first source region 216 and a first drain region 218. As will be understood, the first drain region 218 forms the abovementioned drain 206-1. The floating gate 206-3 is separated from the semiconductor substrate 214 by a first dielectric layer 220. In an implementation, the floating gate 206-3 may be made of a semiconductive polysilicon layer 206-4 and a conductive metal layer 206-5 that are electrically connected to each other. A second dielectric layer 222 is provided atop the floating gate 206-3 to capacitively couple to the floating gate 206-3 to an input gate 224 of the EPROM transistor 206.

When the EPROM cell 200 is to be programmed, the programming voltage $V_p$ is applied at the input gate 224. The programming voltage $V_p$ causes electrons to be injected into the floating gate 206-3. These electrons may be leaked in the predetermined leak time period by operating the control MOSFET 208 that is connected to the floating gate 206-3 to provide an electron leakage path to provide for leakage of the electrons from the floating gate 206-3.

Elaborating on the control MOSFET 208 further, in an example, the control MOSFET 208 comprises a control gate 226 capacitively coupled to a second source region 228 and a second drain region 230 provided in the semiconductor substrate 214. In the illustrated implementation, the second source region 228 is connected to the floating gate 206-3 while the second drain region 230 is grounded, for example, by connecting to the system ground 212. It may be mentioned, that since the drain and source of a MOSFET may be used interchangeably, either one of the second source region 228 and the second drain region 230 may be connected to the floating gate 206-3 while the other may be grounded.

To provide an electron leakage path to the electrons stored in the floating gate 206-3, the control voltage $V_c$ is applied at the control gate 226. On application of the control voltage $V_c$ at the control gate 226, a region of the semiconductor substrate 214 between the second source region 228 and the second drain region 230 gets biased. Accordingly, a variable resistance channel is created between the second source region 228 and the second drain region 230 to allow the leakage of charge from the floating gate 206-3 to the ground.

The resistance of the variable resistance channel is based on the control voltage $V_c$ applied at the control gate 226, and in turn the predetermined leak time period is also based on the control voltage $V_c$ applied at the control gate 226. In one example, the predetermined leak time period is in the range of few microseconds to ten minutes.

Figure 3:
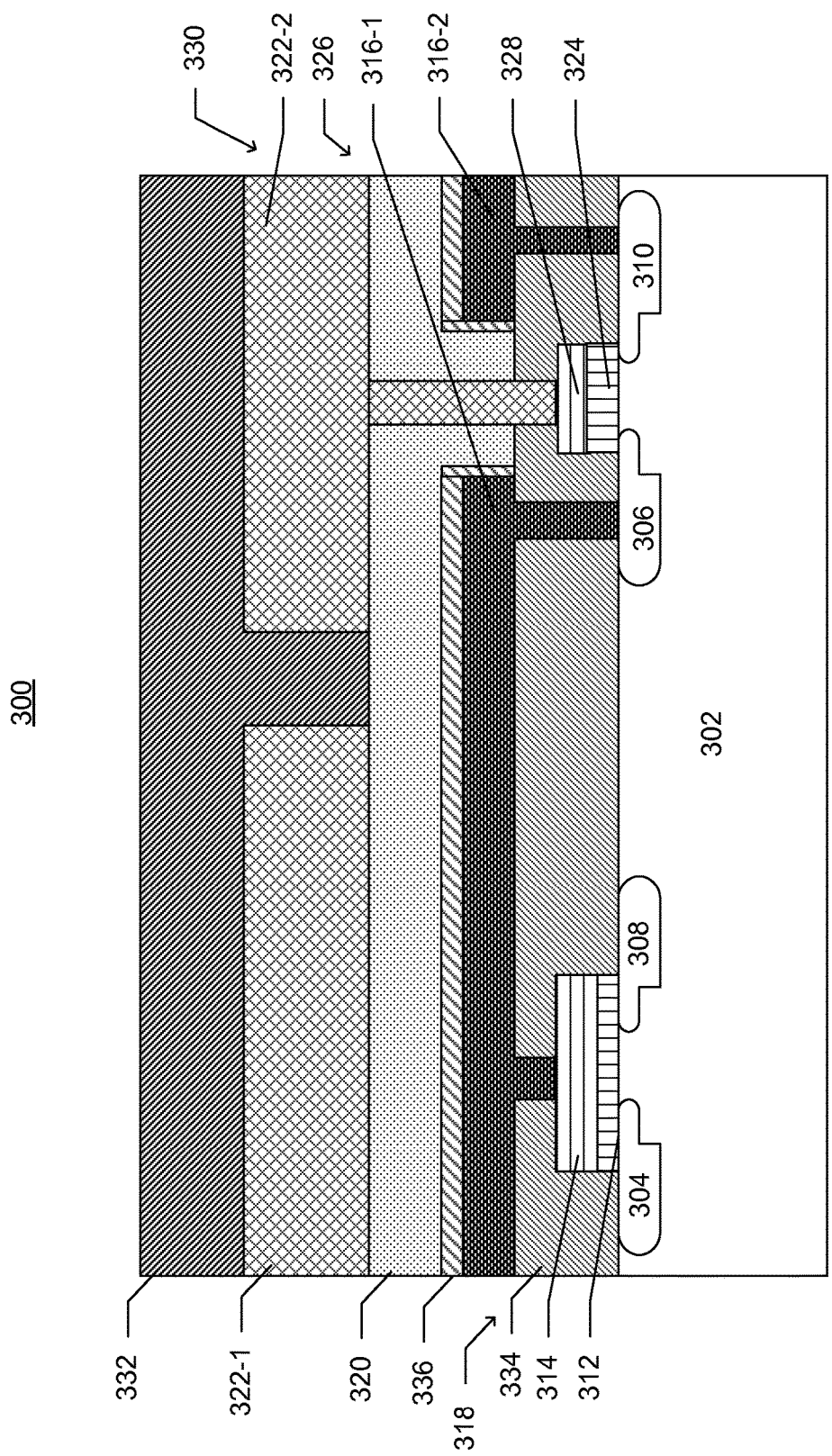
FIG. 3 illustrates a cross-sectional view depicting various layers of the selectively dischargeable EPROM cell, in accordance with one example implementation of the present subject matter.

FIG. 3 shows a cross-sectional view depicting various layers of a selectively dischargeable EPROM cell 300, in accordance with one example implementation of the present subject matter. As mentioned previously, in an EPROM chip having an EPROM array, one or more selectively dischargeable EPROM cells, alike the EPROM cell 300 that is depicted in the figure may be present, while, at the same time, there may be other EPROM cells in the EPROM array that are not selectively dischargeable and may retain the charge after programming. The following description has been explained with reference to an EPROM chip, however it will be appreciated that the principles discussed herein may be extended to other integrated circuits as well, albeit with a few variations.

In an example, the EPROM cell 300 includes a semiconductor substrate layer 302 having n-doped regions and p-doped regions. An n-doped region may form a first source region 304 and another n-doped region may from a second source region 306. Similarly, the p-doped regions may form a first drain region 308 and a second drain region 310. The first source region 304 and the first drain region 308, correspond to the first source region 216 and the first drain region 218 of the EMROM transistor 206 explained earlier in context of FIG. 2b. Similarly the second source region 306 and the second drain region 310, correspond to the second source region 228 and the second drain region 230 of the control MOSFET 208 explained earlier.

The semiconductor substrate layer 302 may comprise, for instance, silicon substrate. Further, in one example, the semiconductor substrate layer 302 may have a thickness of about 675 microns, and the n-doped regions and p-doped regions may have a thickness in a range of about 0.5-3 microns.

A first dielectric layer 312 is provided atop the semiconductor substrate layer 302. In an example, the first dielectric layer 312 may be an oxide layer. The oxide layer may include, for example, silicon dioxide and may have thickness of about 400-900 angstroms (A) in one example. The first dielectric layer 312 is followed by a semiconductive polysilicon layer 314 which is in turn electrically connected to a first conductive metal layer 316-1. The semiconductive polysilicon layer 314 and the first conductive metal layer 316-1 together make a first conductive layer 318 of the EPROM cell 300. The first conductive layer 318 is the floating gate of the EPROM cell 300. The semiconductive polysilicon layer 314 forms a polygate layer and may have a thickness of about 2500-4000 A in one example. Also, in an example, the first conductive metal layer 316-1 may include aluminum copper silicon (AlCuSi), tantalum aluminum (TaAl), or aluminum copper (Alcu), and may have a thickness of about 2-6 kA.

The first dielectric layer 312 capacitively couples the first conductive layer 318 to the semiconductor substrate layer 302. In a similar manner, a second dielectric layer 320 capacitively couples the first conductive layer 318 to a second conductive layer 322-1. The second dielectric layer 320 may be made of Tetraethyl orthosilicate (TEOS) and have a thickness of about 4-8 kA in an example. Further, in an example implementation, the second conductive layer 322-1 may include a TaAl layer and an AlCu layer wherein the TaAl layer may have a thickness of about 4-10 KA and the AlCu layer may have a thickness of about 200-500 A. The second conductive layer 322-1 corresponds to an input gate of the EPROM cell 300, such as the input gate 224, where the programming voltage $V_p$ may be applied for programming a EPROM cell 300.

For the purpose of explanation, while describing the EPROM cell 300 in a bottom up manner, the conductive layer encountered first is referred to as the first conductive layer 318 and the subsequent conductive layer is referred to as the second conductive layer 322-1.

In an example, the first conductive metal layer 316-1 of the first conductive layer 314 is connected to the second source region 306 or the second drain region 310. As will be understood, the second source region 306 and the second drain region 310 are the source and drain, respectively, of a control MOSFET, as alike the control MOSFET 208, included in the EPROM cell 300 to provide for selectively discharging the EPROM cell 300. As mentioned previously, the source and drain of control MOSFET are interchangeable and one amongst the source and drain may be coupled to the first conductive layer 314 i.e., the floating gate, while the other may be grounded. In the illustrated example, the first conductive metal layer 316-1 of the first conductive layer 314 is coupled to the second source region 306 and the second drain region 310 is maintained at ground potential. In an example, the second drain region 310 may be connected to a second conductive metal layer 316-2 which may be connected to a system ground, for example, the system ground 212.

A third dielectric layer 324 capacitively couples the second source region 306 and the second drain region 310 to a third conductive layer 326. In an example, the third dielectric layer 324 may be an oxide layer, for example, silicon dioxide, similar to the first dielectric layer 312. Further, in some example implementations, the third conductive layer 326 may include a polygate layer 328 and a metal layer 322-2, electrically connected to each other. Accordingly, the third conductive layer 326 may be alike the first conductive layer 318 that comprises the semiconductive polysilicon layer 314 connected to the first conductive metal layer 316-1.

As will be understood, the second source region 306, second drain region 310, the third dielectric layer 324 and the third conductive layer 326 are components of the control MOSFET of the EPROM cell 300 that corresponds to the control MOSFET 208 explained earlier. Further, the third conductive layer 326 the control MOSFET of the EPROM cell 300 corresponds to the control gate 226 of the control MOSFET 208 where the control voltage $V_c$ may be applied to operate the control MOSFET of the EPROM cell 300.

In an example implementation, the metal layer 322-2 of the third conductive layer 326 and the second conductive layer 322-1 are formed in a common metal layer 330, electrically isolated from each other.

In one example, a passivation layer 332 may be disposed atop the common metal layer 330 in which the second conductive layer 322-1 and the metal layer 322-2 of the third conductive layer 326 are formed. The passivation layer 332 electrically isolates the second conductive layer 322-1 from the third conductive layer 326. Examples of materials that may be used to form the passivation layer 332 include Silicon Nitride (Si3N4) and Silicon Carbide (SiC) present in the ratio of 2:1. In an example implementation, the passivation layer 332 may have a thickness of about 2500-5000 A.

Further, insulating layers may be deposited between the conductive layers. In the illustrated example implementation, a first insulating layer 334 is provided over the semiconductive polysilicon layer 314, partially surrounding the semiconductive polysilicon layer 314 and the second dielectric layer 312. In one example, the first insulating layer 334 may comprise Borophosphosilicate glass (BPSG)/undoped silicon glass (USG). For example, about 6-10 KA of BPSG may be disposed atop 2-4 kA of USG to form the first insulating layer 334.

Additionally, in some example implementations, a barrier layer 336 may further be provided between the first conductive layer 314 and the second dielectric layer 320. As illustrated, the barrier layer 336 may be provided to surround the first conductive metal layer 316-1 of the first conductive layer 318. In an example, Si3N4 and may used to form the barrier layer 336.

In operation, a high voltage bias, i.e., programming voltage $V_p$, applied across the first drain region 308 and the second conductive layer 322-1 generates energetic electrons, and a positive bias between the first drain region 308 and the second conductive layer 322-1 may pull some of the generated electrons into the first conductive layer 318, i.e., the floating gate. Depending on the configuration of the integrated circuit, in one example, the programming voltage $V_p$, may be in the range of 12-20V. As more and more electrons are pulled onto the floating gate, the voltage to cause the floating gate to conduct current increases, and eventually the voltage may become more than, say, an operating voltage of the EPROM cell 300. This causes the floating gate to block current and store the applied charge, i.e., free electrons.

The electrons may ordinarily remain trapped in the floating gate. However, in accordance with one example implementation of the present subject matter, the control voltage $V_c$ may be applied at the third conductive layer 326, i.e., the control gate of the EPROM cell 300 to bias a region of the semiconductor substrate layer 302 between the second source region 306 and the second drain region 310 to allow the leakage of charge from the floating gate to the ground through the second conductive metal layer 316-2. The application of the control voltage $V_c$ provides an electron leakage path that allows leakage of charge from the floating gate in a predetermined leak time period. The predetermined leak time period is a function of the control voltage $V_c$. In one example implantation, depending on the configuration of the EPROM cell 300, the control voltage $V_c$ may be selected such that the predetermined leak time period is in the range of few microseconds to ten minutes. In said example, the control voltage $V_c$, may be in the range of 0.2-5V.

The various layers depicted in the figure correspond to the EPROM cell 300 that is selectively dischargeable, according to an example of the present subject matter. Other EPROM cells that retain the charge after programming, may also be present in the integrated circuit. In an example, the EPROM cells that retain the charge be implemented in a similar manner by excluding the control MOSFETs that provides the electron leakage path from EPROM cells. Referring to the illustrated implementation, an EPROM cell that is not selectively dischargeable may not include the second source region 306 and the second drain region 310 along with the third dielectric layer 324 and the third conductive layer 326.

Accordingly in an example implementation, an integrated circuit may include one or more selectively dischargeable EPROM cells at certain locations with the control MOSFETs, while the control MOSFETs may be absent at other locations. In an example, the third conductive layer. i.e., the control gate of each of the one or more selectively dischargeable EPROMs of the integrated circuit may be coupled to a common pin of the integrated circuit. The common pin may be connected to a system input to receive the control voltage $V_c$ to operate the control MOSFETs to selectively discharge the one or more selectively dischargeable EPROM cells.

The discharging of the one or more selectively dischargeable EPROM cells may cause a change in date written onto the integrated circuit. In one example implementation, the change in the data may be determined based on the predetermined locations of such EPROM cells. Further, the change in data, in one example, may in turn provide for product identification as explained earlier.

Although implementations for integrated circuits and selectively dischargeable EPROM cells have been described in language specific to structural features and/or methods, it would be understood that the appended claims are not necessarily limited to the specific features or methods described. Rather, the specific features and methods are disclosed as example implementations for integrated circuits.

We claim:

1. A selectively dischargeable erasable programmable read only memory (EPROM) cell comprising:
    a semiconductor substrate having a first source region and a first drain region;
    a floating gate separated from the semiconductor substrate by a first dielectric layer;
    an input gate capacitively coupled to the floating gate through a second dielectric layer disposed between the floating gate and the input gate, the input gate to receive a programming voltage to program the EPROM cell that causes trapping of electrons in the floating gate; and
    a control metal oxide semiconductor field-effect transistor (MOSFET) connected to the floating gate, the control MOSFET comprising a control gate to receive a control voltage as part of an operation that includes an application of the programming voltage at the input gate, the control voltage applied simultaneously with or after a time gap from the application of the programming voltage to operate the control MOSFET to provide an electron leakage path that discharges the trapped electrons from the floating gate in a predetermined leak time period.

2. The selectively dischargeable EPROM cell as claimed in claim 1, wherein the
    control gate is capacitively coupled to a second source region and a second drain region provided in the semiconductor substrate, wherein one of the second source region and the second drain region is connected to ground and the other of the second source region and the second drain region is coupled to the floating gate, wherein the control voltage applied at the control gate is to bias a region of the semiconductor substrate between the second source region and the second drain region to allow the leakage of charge from the floating gate to the ground.

3. The selectively dischargeable EPROM cell as claimed in claim 2, wherein the predetermined leak time period is based on the control voltage applied at the control gate.

4. The selectively dischargeable EPROM cell as claimed in claim 2, wherein the input gate and the control gate are formed in a common metal layer, electrically isolated from each other.

5. The selectively dischargeable EPROM cell as claimed in claim 1, wherein the predetermined leak time period is in a range of few microseconds to ten minutes.

6. The selectively dischargeable EPROM cell as claimed in claim 1, wherein the floating gate comprises a semiconductive polysilicon layer and a conductive metal layer electrically connected to each other.

7. The selectively dischargeable EPROM cell as claimed in claim 1, further comprising:
a column control transistor and a row control transistor connected in series with an EPROM transistor comprising the floating gate and the input gate.

8. The selectively dischargeable EPROM cell as claimed in claim 1, wherein the control voltage is applied simultaneously with the programming voltage.

9. An integrated circuit comprising:
an erasable programmable read only memory (EPROM) array having a plurality of EPROM cells disposed in rows and columns, wherein one or more EPROM cells, each at predetermined positions in the EPROM array, are selectively dischargeable, each of the one or more EPROM cells comprising:
an EPROM transistor comprising an input gate and a first conductive layer, wherein the first conductive layer is to store electrons responsive to a programming voltage applied at the input gate that causes trapping of electrons in the first conductive layer; and
a control metal oxide semiconductor field-effect transistor (MOSFET) electrically connected to the first conductive layer of the EPROM transistor, the control MOSFET comprising a control gate to receive a control voltage as part of an operation that includes the applying of the programming voltage at the input gate, the control voltage applied simultaneously with or after a time gap from the applying of the programming voltage to operate the control MOSFET to provide an electron leakage path that dissipates the trapped electrons from the first conductive layer in a predetermined leak time period.

10. The integrated circuit as claimed in claim 9, wherein the EPROM transistor comprises:
a semiconductor substrate layer, having a first source region and a first drain region;
the first conductive layer, separated from the semiconductor substrate layer by a first dielectric layer; and
a second conductive layer comprising the input gate, the second conductive layer capacitively coupled to the first conductive layer through a second dielectric layer disposed between the first conductive layer and the second conductive layer.

11. The integrated circuit as claimed in claim 10, wherein the control MOSFET comprises:
a third conductive layer capacitively coupled to a second source region and a second drain region provided in the semiconductor substrate layer, wherein one of the second source region and the second drain region is connected to ground and the other of the second source region and the second drain region is coupled to the first conductive layer, the third conductive layer comprising the control gate.

12. The integrated circuit as claimed in claim 11, wherein the control MOSFET has a variable resistance channel based on the control voltage applied at the third conductive layer, and wherein the predetermined leak time period is based on the control voltage applied at the third conductive layer.

13. The integrated circuit as claimed in claim 11, wherein the third conductive layer comprises a polygate layer and a metal layer electrically connected to each other.

14. The integrated circuit as claimed in claim 13, wherein the second conductive layer and the metal layer of the third conductive layer are formed in a common metal layer, electrically isolated from each other.

15. The integrated circuit as claimed in claim 11, wherein the third conductive layer of each of the one or more EPROM cells are commonly coupled to a pin of the integrated circuit, wherein the pin is to receive the control voltage from a system input.

16. The integrated circuit as claimed in claim 9, wherein the first conductive layer comprises a semiconductive polysilicon layer and a conductive metal layer electrically connected to each other.

17. The integrated circuit as claimed in claim 9, wherein the predetermined leak time period is in a range of few microseconds to ten minutes.

18. The integrated circuit of claim 9, wherein each of the one or more EPROM cells further comprises:
a column control transistor and a row control transistor connected in series with the EPROM transistor.

19. The integrated circuit as claimed in claim 9, wherein the control voltage is applied simultaneously with the programming voltage.

20. A method comprising:
applying a programming voltage to an input gate of an erasable programmable read only memory (EPROM) cell comprising a semiconductor substrate having a first source region and a first drain region, a floating gate separated from the semiconductor substrate by a first dielectric layer, and the input gate capacitively coupled to the floating gate through a second dielectric layer disposed between the floating gate and the input gate, the programming voltage programming the EPROM cell by trapping electrons in the floating gate; and
applying a control voltage to a control gate of a control metal oxide semiconductor field-effect transistor (MOSFET) connected to the floating gate, the control MOSFET part of the EPROM cell, and the control voltage causing discharge of the trapped electrons from the floating gate in a predetermined leak time period, the control voltage applied as part of an operation that includes the applying of the programming voltage, and the control voltage applied simultaneously with or a time gap after the applying of the programming voltage.

* * * * *